(12) United States Patent
Zhang et al.

(10) Patent No.: US 9,123,592 B1
(45) Date of Patent: Sep. 1, 2015

(54) ARRAY SUBSTRATE AND METHOD FOR MANUFACTURING THE SAME, DISPLAY APPARATUS

(71) Applicants: BOE Technology Group Co., Ltd., Beijing (CN); Beijing BOE Display Technology Co., Ltd., Beijing (CN)

(72) Inventors: Zhenyu Zhang, Beijing (CN); Xibin Shao, Beijing (CN); Yanping Liao, Beijing (CN); Yoon Dae Keun, Beijing (CN); Dan Wang, Beijing (CN)

(73) Assignees: BOE Technology Group Co., Ltd., Beijing (CN); Beijing BOE Display Technology Co., Ltd., Beijing (CN)

(*) Notice: Subject to any disclaimer, the term of this patent is extended or adjusted under 35 U.S.C. 154(b) by 0 days.

(21) Appl. No.: 14/444,137

(22) Filed: Jul. 28, 2014

(30) Foreign Application Priority Data

Feb. 28, 2014 (CN) .......................... 2014 1 0073497

(51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *H01L 27/12* | (2006.01) |
| *H01L 21/768* | (2006.01) |
| *H01L 23/522* | (2006.01) |
| *G02F 1/1368* | (2006.01) |
| *G02F 1/1362* | (2006.01) |
| *G02F 1/1333* | (2006.01) |
| *G02F 1/1343* | (2006.01) |

(52) U.S. Cl.
CPC ............ *H01L 27/124* (2013.01); *G02F 1/1368* (2013.01); *G02F 1/13439* (2013.01); *G02F 1/133345* (2013.01); *G02F 1/136286* (2013.01); *H01L 21/768* (2013.01); *H01L 23/5226* (2013.01); *H01L 27/1259* (2013.01); *G02F 2001/13629* (2013.01); *G02F 2001/136295* (2013.01)

(58) Field of Classification Search
CPC .............. H01L 27/1214; H01L 27/124; H01L 27/3248; H01L 27/14603; H01L 27/3244; H01L 27/3262; H01L 27/3276; H01L 29/786; H01L 29/4908; H01L 29/458
See application file for complete search history.

(56) References Cited

U.S. PATENT DOCUMENTS

2011/0304787 A1* 12/2011 Wang et al. .................... 349/33
2014/0036186 A1* 2/2014 Wang et al. .................... 349/41

* cited by examiner

*Primary Examiner* — Thanh Y Tran
(74) *Attorney, Agent, or Firm* — Westman, Champlin & Koehler, P.A.

(57) ABSTRACT

An array substrate is disclosed. The array substrate comprises a substrate, a plurality of common electrodes formed on the substrate, a plurality of gate signal lines formed above the common electrodes, and a plurality of common electrode signal line units corresponding to the plurality of common electrodes, respectively. The plurality of common electrode signal line units are formed on the corresponding common electrodes, respectively. Each of the common electrode signal line units comprises a first common electrode signal line perpendicular to the gate signal line and a second common electrode signal line parallel to the gate signal line. The first and second common electrode signal lines are made of metal and cross with each other and are electrically connected to each other. Two adjacent common electrode signal line units are electrically connected by a bridge line. The present disclosure also relates to a method for manufacturing the array substrate and a display apparatus.

20 Claims, 6 Drawing Sheets

ARRAY SUBSTRATE AND METHOD FOR MANUFACTURING THE SAME, DISPLAY APPARATUS

CROSS-REFERENCE TO RELATED APPLICATION

This application claims the benefit of Chinese Patent Application No. 201410073497.X filed on Feb. 28, 2014 in the State Intellectual Property Office of China, the whole disclosure of which is incorporated herein by reference.

BACKGROUND OF THE INVENTION

1. Field of the Invention

The present invention relates to a display technology field, more particularly, relates to an array substrate, a method for manufacturing the array substrate, and a display apparatus comprising the array substrate.

2. Description of the Related Art

Figure 1:
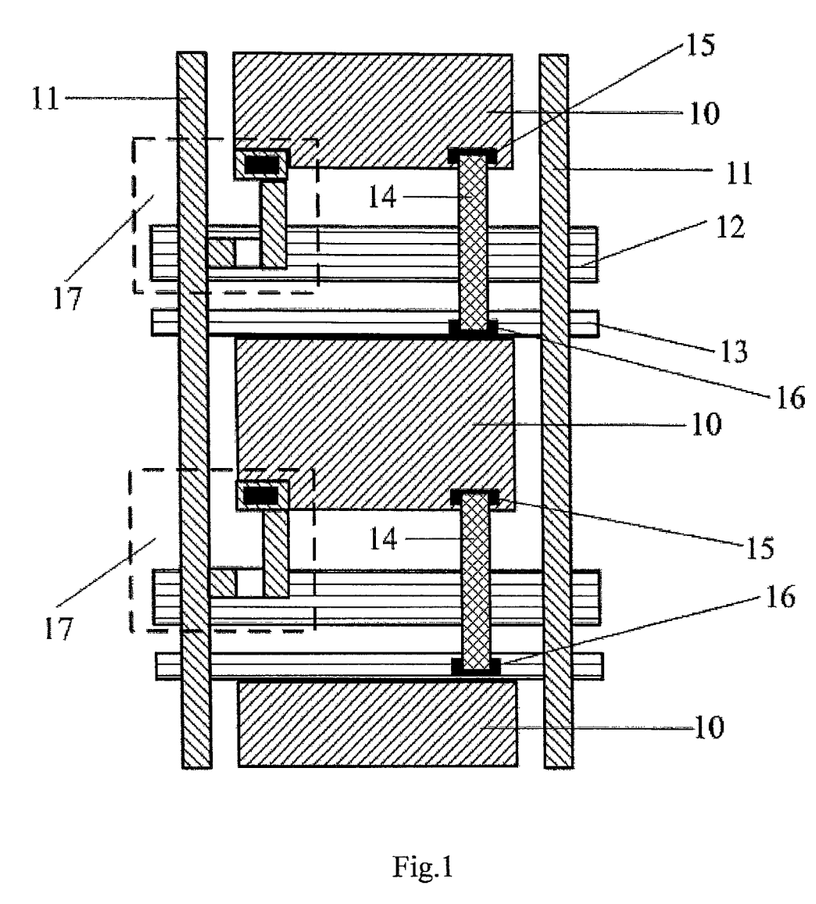
FIG. 1 is an illustrative structure view of an arrangement of common electrodes of an array substrate in the prior art.

So far, in a fringe field switching (FFS) mode of liquid crystal display panel, common electrodes Vcom arranged in a direction parallel to a data signal line, that is, in a direction perpendicular to a gate signal line, are made mostly of indium tin oxide (ITO) as conductive medium, and a bridge line for connecting adjacent common electrodes is also made of indium tin oxide. For example, as shown in FIG. 1, in the prior art, manufacturing the FFS mode of liquid crystal display panel mainly comprises a step of: forming a transparent conductive layer of ITO on a glass substrate, and etching the transparent conductive layer of ITO to form the common electrodes 10. As shown in FIG. 1, the data signal line 11 extends in a direction perpendicular to the gate signal line 12, and the common electrodes 10 arranged in the direction perpendicular to the gate signal line 12, that is, in the direction parallel to the data signal line 11, are made mostly of indium tin oxide as conductive medium. Thereby, the common electrodes 10 have high resistance.

Also, a common electrode signal line 13 for providing signals to the common electrode 10 extends in a direction parallel to the gate signal line 12. The common electrode signal line 13 is electrically connected to the common electrode 10 by a bridge line 14 crossing over the gate signal line 12. As shown in FIG. 1, one end of the bridge line 14 is electrically connected to the common electrode 10 through a via 15 located above the common electrode 10, and the other end of the bridge line 14 is electrically connected to the common electrode signal line 13 through a via 16 located above the common electrode signal line 13. The bridge line 14 is made of ITO and in the same layer as a pixel electrode of the FFS mode of liquid crystal display panel. As shown in FIG. 1, a thin film transistor 17 is formed in the prior art. Similarly, since the bridge line is made of ITO, the bridge line has high resistance. As shown in FIG. 1, the common electrode 10, the common electrode signal line 13 and the bridge line 14 are made in different layers from each other, but the common electrode signal line 13 and the gate signal line 12 both are made in the same layer.

In sum, in the prior art, the common electrode of the FFS mode of liquid crystal display panel has high resistance and poor resistance uniformity in the direction perpendicular to the gate signal line. As a result, voltage cannot be uniformly distributed on the common electrode, and it likely leads to various defects, for example, residual image, occurring in the liquid crystal display panel.

SUMMARY OF THE INVENTION

The present invention has been made to overcome or alleviate at least one aspect of the above mentioned disadvantages.

According to an object of the present invention, there is provided an array substrate, a method for manufacturing the array substrate, and a display apparatus comprising the array substrate, in which a common electrode of the array substrate has reduced resistance and improved resistance uniformity in a direction perpendicular to a gate signal line, thereby improving the image display quality of the display apparatus.

According to an aspect of the present invention, there is provided an array substrate, comprising:

a substrate;

a plurality of common electrodes formed on the substrate;

a plurality of gate signal lines formed above the common electrodes; and a plurality of common electrode signal line units corresponding to the plurality of common electrodes, respectively, and formed on the corresponding common electrodes, respectively, wherein each of the common electrode signal line units comprises a first common electrode signal line perpendicular to the gate signal line and a second common electrode signal line parallel to the gate signal line;

wherein the first common electrode signal line and the second common electrode signal line both are made of metal;

wherein the first common electrode signal line and the second common electrode signal line of each of the common electrode signal line units cross with each other and are electrically connected to each other; and wherein two adjacent common electrode signal line units are electrically connected by a bridge line.

According to another aspect of the present invention, there is provided a display apparatus comprising the above array substrate.

According to another aspect of the present invention, there is provided a method for manufacturing an array substrate, comprising steps of:

forming a plurality of common electrodes on a substrate;

forming a plurality of gate signal lines and a plurality of common electrode signal line units corresponding to the plurality of common electrodes, respectively, on the substrate;

forming a plurality of data lines and a plurality of bridge lines on the substrate; and sequentially forming an insulation layer and a plurality of pixel electrodes on the substrate, wherein each of the common electrode signal line units comprises a first common electrode signal line perpendicular to the gate signal line and a second common electrode signal line parallel to the gate signal line;

wherein the first common electrode signal line and the second common electrode signal line both are made of metal;

wherein the first common electrode signal line and the second common electrode signal line of each of the common electrode signal line units cross with each other and are electrically connected to each other; and wherein two adjacent common electrode signal line units are electrically connected by the bridge line.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present invention, there is provided an array substrate, comprising: a substrate; a plurality of common electrodes formed on the substrate; a plurality of gate signal lines formed above the common electrodes; and a plurality of common electrode signal line units corresponding to the plurality of common electrodes, respectively, and formed on the corresponding common electrodes, respectively. Each of the common electrode signal line units comprises a first common electrode signal line perpendicular to the gate signal line and a second common electrode signal line parallel to the gate signal line. The first common electrode signal line and the second common electrode signal line both are made of metal. The first common electrode signal line and the second common electrode signal line of each of the common electrode signal line units cross with each other and are electrically connected to each other. Two adjacent common electrode signal line units are electrically connected by a bridge line.

Figure 2:
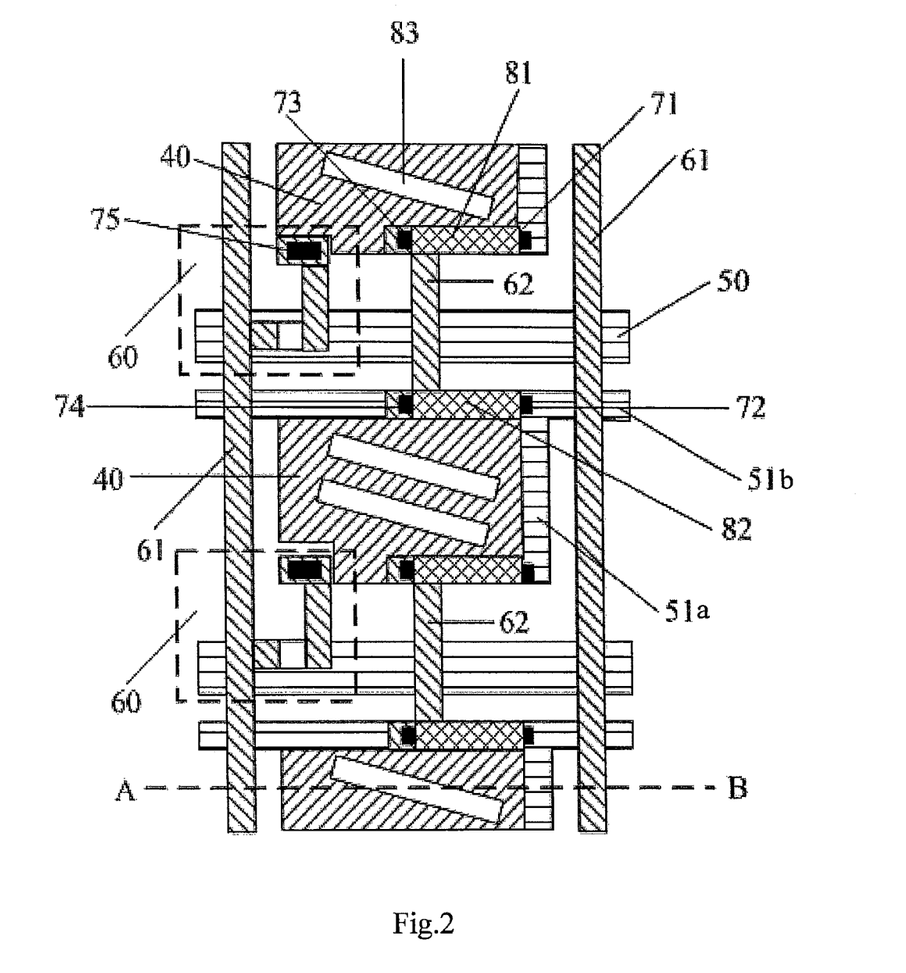
FIG. 2 is an illustrative plan structure view of an array substrate according to an exemplary embodiment of the present invention.

FIG. 2 is an illustrative plan structure view of an array substrate according to an exemplary embodiment of the present invention.

As shown in FIG. 2, in an exemplary embodiment of the present invention, the array substrate mainly comprises a substrate, a plurality of common electrodes 40, a plurality of thin film transistors 60, a plurality of gate signal lines 50 and a plurality of common electrode signal line units 51. In the illustrated embodiment, the thin film transistor 60 is composed of a gate electrode, a gate insulation layer, a semiconductor active layer, a source electrode and a drain electrode. The plurality of common electrodes 50 are formed on the substrate, the plurality of gate signal lines 50 are formed above the common electrodes 40, and the plurality of common electrode signal line units 51 are formed on the common electrodes 40.

Referring to FIG. 2, in an exemplary embodiment, the plurality of common electrode signal line units 51 correspond to the plurality of common electrodes 40, respectively, and are formed on the corresponding common electrodes 40, respectively. Each of the common electrode signal line units 51 comprises a first common electrode signal line 51a perpendicular to the gate signal line 50 and a second common electrode signal line 51b parallel to the gate signal line 50. The first common electrode signal line 51a and the second common electrode signal line 51b both are made of metal.

As shown in FIG. 2, in the illustrated embodiment, the first common electrode signal line 51a and the second common electrode signal line 51b of each of the common electrode signal line units 51 cross with each other and are electrically connected to each other. In an exemplary embodiment of the present invention, an end portion of the first common electrode signal line 51a crosses the second common electrode signal line 51b and is electrically connected to the second common electrode signal line 51b.

Please refer to FIG. 2, in the illustrated embodiment, two adjacent common electrode signal line units 51 are electrically connected by a bridge line 62.

In the embodiment shown in FIG. 2, the plurality of common electrodes 40 and the plurality of corresponding common electrode signal line units 51 are arranged in a matrix with multiple rows and multiple columns. Please be noted that only one column of common electrodes 40 and corresponding common electrode signal line units 51 are shown in FIG. 2.

Also, as shown in FIG. 2, the array substrate may further comprise data signal lines 61 formed above the gate signal lines 50 and the common electrode signal lines 51a, 51b, an insulation layer formed above the data signal lines 61, and pixel electrodes formed above the insulation layer.

In the array substrate according to the above embodiments of the present invention, the common electrode signal line unit corresponding to each of the common electrodes comprises the first common electrode signal line perpendicular to the gate signal line and the second common electrode signal line parallel to the gate signal line, the first common electrode signal line and the second common electrode signal line both are made of metal, the first common electrode signal line and the second common electrode signal line of each of the common electrode signal line units cross with each other and are electrically connected to each other, and two adjacent common electrode signal line units are electrically connected by the bridge line. Thereby, it can reduce the resistance of the common electrode in the direction perpendicular to the gate signal line, and in turn decrease voltage distribution gradient in the direction perpendicular to the gate signal line, increasing the resistance uniformity of the array substrate, and improving image display quality of a display apparatus comprising the array substrate.

As shown in FIG. 2, in an exemplary embodiment of the present invention, the bridge line is made of metal and formed in the same layer as the data signal line, the source electrode and the drain electrode.

In this way, as shown in FIG. 2, since the bridge line formed in the same layer as the data signal line is made of metal in the array substrate according to the above embodiment of the present invention, it also can reduce the resistance of the common electrode in the direction perpendicular to the gate signal line, further increasing the resistance uniformity of the array substrate, and further improving image display quality of the display apparatus comprising the array substrate.

Also, the bridge line, the data signal line, the source electrode and the drain electrode are all made in the same layer, simplifying the manufacture of the array substrate in practice, and saving the cost.

In an exemplary embodiment of the present invention, as shown in FIG. 2, two adjacent first common electrode signal lines 51a are electrically connected by the bridge line 62 through a first via 71, a second via 72, a third via 73 and a fourth via 74.

In this way, in practice, two adjacent common electrode signal lines arranged in the direction perpendicular to the gate signal line can be easily and simply electrically connected to each other by the bridge line 62 through the first via 71, the second via 72, the third via 73 and the fourth via 74.

In an exemplary embodiment of the present invention, as shown in FIG. 2, the first common electrode signal line 51a, the second common electrode signal line 51b, the gate electrode and the gate signal line 50 are made in the same layer.

In this way, since the common electrode signal line 51a, 51b, the gate electrode and the gate signal line 50 are made in the same layer, the array substrate can be easily and simply manufactured in practice, and the cost of the array substrate can be saved.

In an exemplary embodiment of the present invention, the common electrode is made of indium tin oxide, because the common electrode of ITO can be easily and simply made in practice.

In an exemplary embodiment of the present invention, the pixel electrode is made of indium tin oxide, because the pixel electrode of ITO can be easily and simply made in practice.

Figure 3:
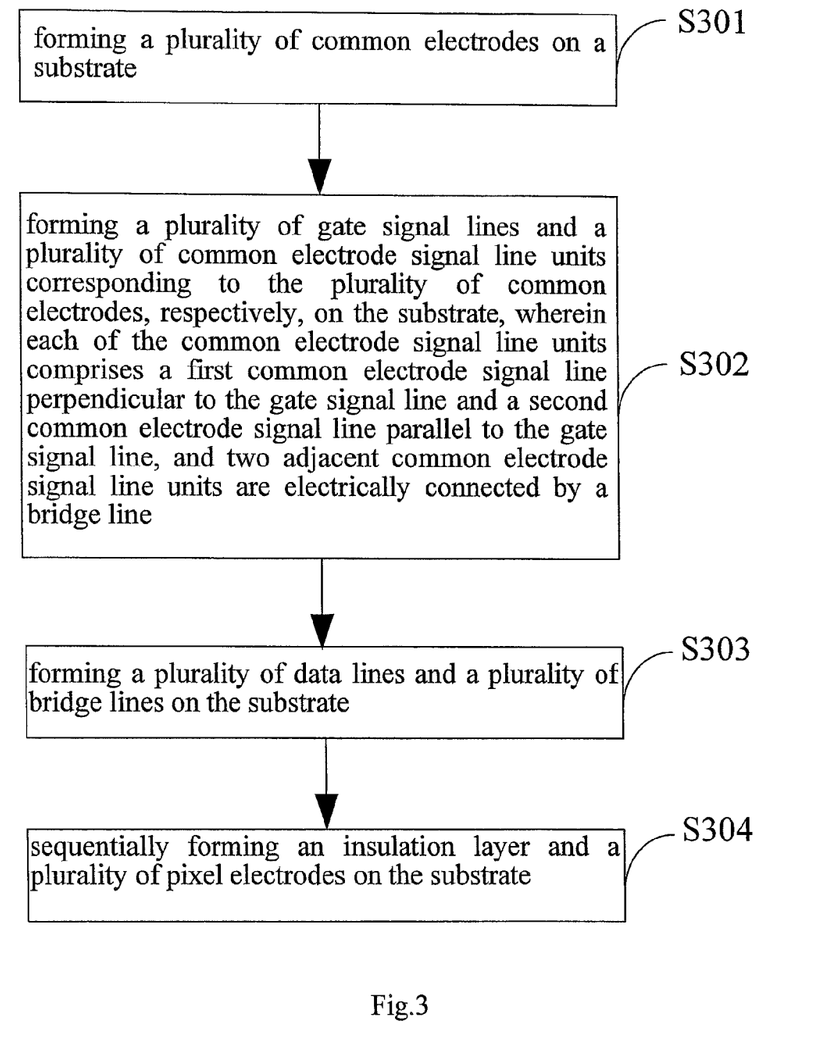
FIG. 3 is an illustrative flow chart of manufacturing an array substrate according to an exemplary embodiment of the present invention.

FIG. 3 is an illustrative flow chart of manufacturing an array substrate according to an exemplary embodiment of the present invention.

As shown in FIG. 3, according to an exemplary embodiment of the present invention, there is also provided a method for manufacturing an array substrate, the method may comprise steps of:

S301: forming a plurality of common electrodes on a substrate;

S302: forming a plurality of gate signal lines and a plurality of common electrode signal line units corresponding to the plurality of common electrodes, respectively, on the substrate;

S303: forming a plurality of data lines and a plurality of bridge lines on the substrate; and S304: sequentially forming an insulation layer and a plurality of pixel electrodes on the substrate, wherein each of the common electrode signal line units comprises a first common electrode signal line perpendicular to the gate signal line and a second common electrode signal line parallel to the gate signal line;

wherein the first common electrode signal line and the second common electrode signal line both are made of metal;

wherein the first common electrode signal line and the second common electrode signal line of each of the common electrode signal line units cross with each other and are electrically connected to each other; and wherein two adjacent common electrode signal line units are electrically connected by a bridge line.

FIGS. 4-8 show plan structure views at different stages of manufacturing an array substrate according to an exemplary embodiment of the present invention.

Hereafter, it will describe in detail a method of manufacturing an array substrate according to an exemplary embodiment of the present invention with reference to FIGS. 4-8.

Figure 4:
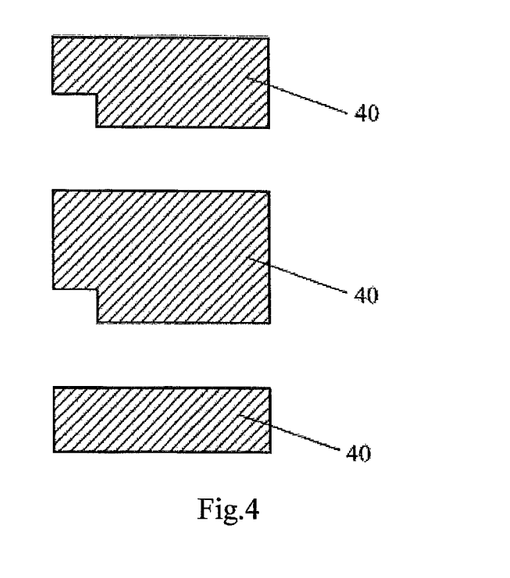
FIGS. 4-8 show plan structure views at different stages of manufacturing an array substrate according to an exemplary embodiment of the present invention.

Firstly, as shown in FIG. 4, forming a first ITO layer on a substrate and etching the first ITO layer to form common electrodes 40, wherein the substrate may be a glass substrate in an exemplary embodiment.

Figure 5:
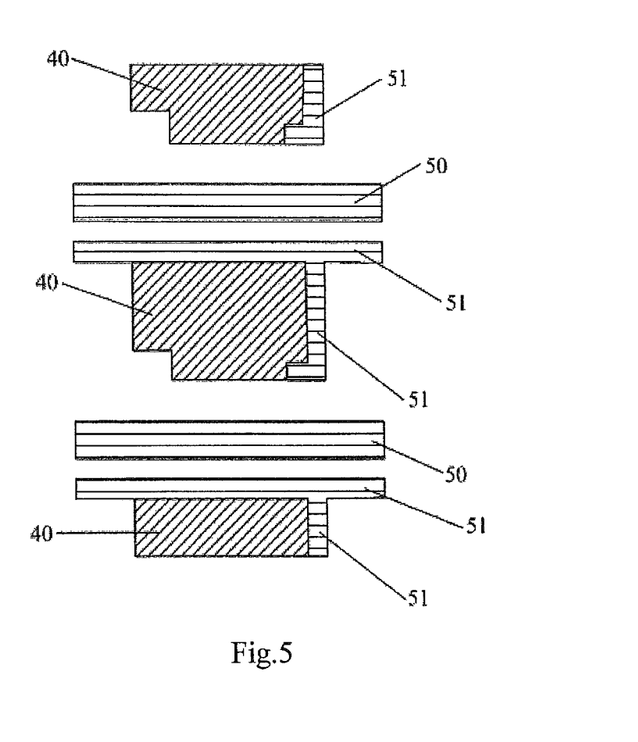

Secondly, as shown in FIG. 5, forming a metal layer on the substrate and etching the metal layer to form gate signal lines 50 and common electrode signal lines 51, wherein the common electrode signal lines 51 comprise first common electrode signal lines 51a extending in a direction perpendicular to the gate signal line 50 and second common electrode signal lines 51b extending in a direction parallel to the gate signal line 50, and the first and second common electrode signal lines 51a, 51b cross with each other and are arranged in a matrix. Within each cell of the matrix defined by the common electrode signal lines, a corresponding common electrode 40 is disposed. The first common electrode signal line 51a extending in the direction perpendicular to the gate signal line 50 crosses over the gate signal line 50 through a bridge line formed later, meanwhile, the metal layer on the substrate is etched to form gate electrodes (not shown) of thin film transistors in the embodiment of the present invention. The gate electrode of the thin film transistor, the gate signal line 50 and the common electrode signal line 51 are made in the same layer. Herein, the metal layer may be formed on the substrate in a conventional way, for example, the metal layer may be a single metal layer or a composite metal layer.

Figure 6:
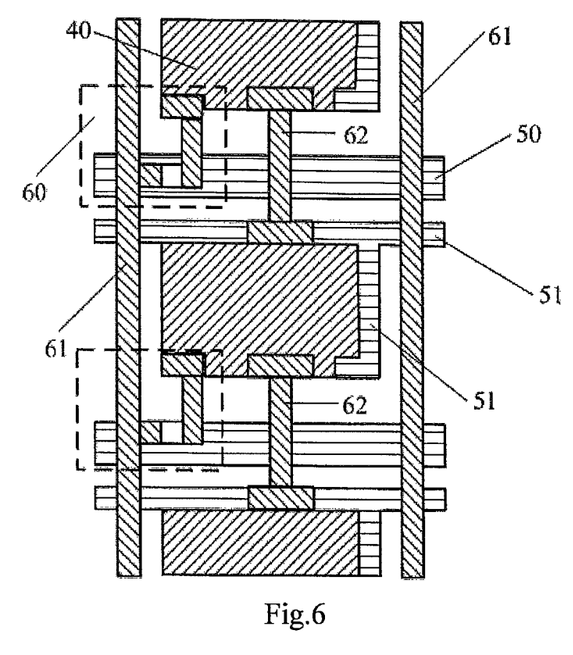

Thirdly, as shown in FIG. 6, depositing a gate insulation layer, a semiconductor active layer, a metal layer on the substrate and etching these layers to form the thin film transistors 60 and data signal lines 61. Herein, the thin film transistors 60 and data signal lines 61 may be formed in a conventional way, and the descriptions of them are omitted. Meanwhile, in the embodiment of the present invention, different from the prior art, the deposited metal layer is also etched to form bridge lines 62. The common electrode signal line 51 crosses over the gate signal line 50 through the bridge line 62. The bridge line 62, the source and drain electrodes of the thin film transistor 60, and the data signal line 61 are all made in the same layer. The bridge line 62 may be positioned at different locations in different designs according to various processing requirements, and the present invention is not limited to the illustrated embodiment.

Figure 7:
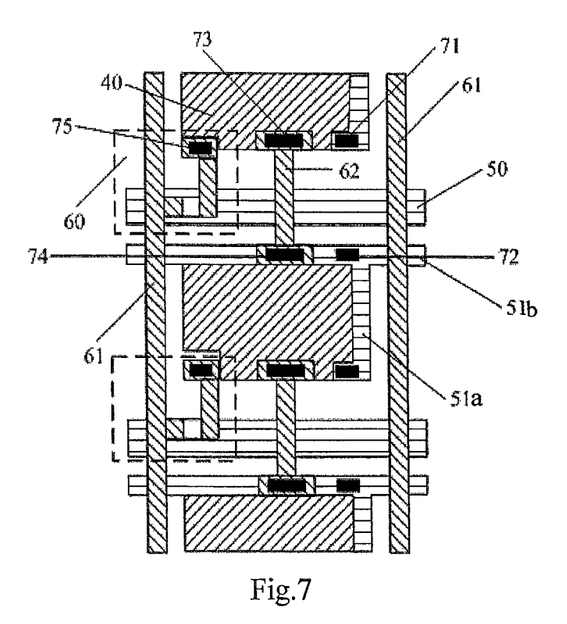
Figure 8:
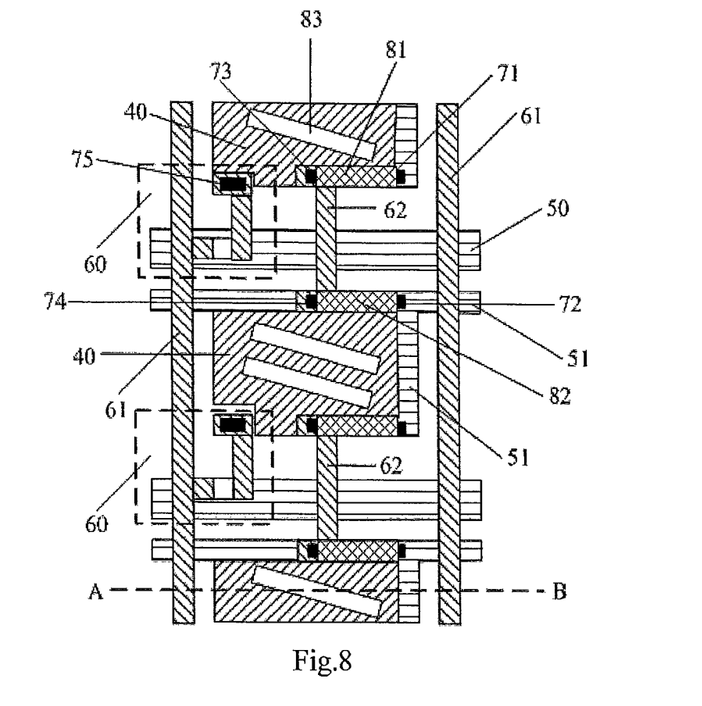

Fourthly, as shown in FIG. 7, depositing an insulation layer (not shown) on the substrate and forming a first via 71, a second via 72, a third via 73, a fourth via 74 and a fifth via 75 in the insulation layer by etching. The first via 71 is located above the first common electrode signal line 51a extending in a direction perpendicular to the gate signal line 50, and passes through the insulation layer and the data signal line 61. The second via 72 is located above the second common electrode signal line 51b extending in a direction parallel to the gate signal line 50, and passes through the insulation layer and the data signal line 61. The third via 73 and the fourth via 74 are located above the bridge line 62, and passes through the insulation layer. One of pixel electrodes is formed between and inside the first and third vias 71 and 73 to electrically connect the first common electrode signal line 51a, extending in the direction perpendicular to the gate signal line 50, of one of the common electrodes in one column to the bridge line 62. Another of the pixel electrodes is formed between and inside the second and fourth vias 72 and 74 to electrically connect the first common electrode signal line 51 of another of the common electrodes in said one column, adjacent to said one of the common electrodes in said one column, to the bridge line 62. The fifth via 75 is located above the drain electrode of the thin film transistor 60 and passes through the insulation layer and the data line 61. The pixel electrode, will be deposited later as shown FIG. 8, is electrically connected to the drain electrode of the thin film transistor through the fifth via 75. In an exemplary embodiment, the pixel electrode may be made of ITO.

Finally, as shown in FIG. 8, depositing a second ITO layer on the substrate of FIG. 7 and etching the second ITO layer to form the one pixel electrode 81 located between and inside the first and third vias 71 and 73 to electrically connect the first common electrode signal line 51a, extending in the direction perpendicular to the gate signal line 50, of one of the common electrodes in one column to the bridge line 62 and the another pixel electrode 82 located between and inside the second and fourth vias 72 and 74 to electrically connect the first common electrode signal line 51 of another of the common electrodes 40 in said one column, adjacent to said one of the common electrodes in said one column, to the bridge line 62. As shown in FIG. 8, in an exemplary embodiment, the pixel electrode is formed with an opening 83. In this way, the bridge line 62 can be electrically connected to adjacent common electrode signal lines 51 extending in the direction perpendicular to the gate signal line 50. The bridge line 62, the source and drain electrodes of the thin film transistor, and the data signal line 61 are all made in the same layer. The bridge line is made of metal having low resistance. Thereby, compared with the bridge line made of ITO in the prior art, the bridge line 62 made of metal in the embodiment of the present invention can reduce the resistance of the common electrode in the direction perpendicular to the gate signal line 50, and improve the resistance uniformity of the common electrode.

Figure 9:
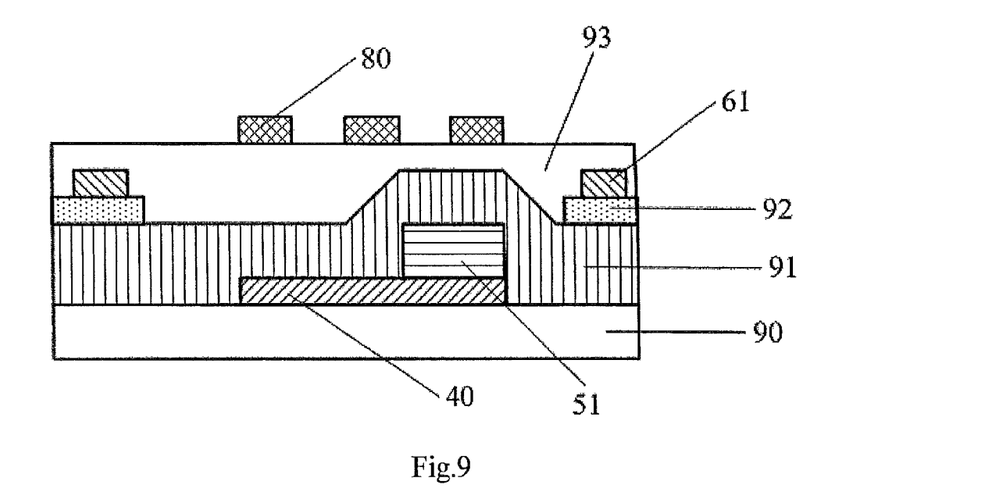
FIG. 9 is an illustrative cross section view of the array substrate of FIG. 8 taken in a line AB.

FIG. 9 is an illustrative cross section view of the array substrate of FIG. 8 taken in a line AB.

As shown in FIG. 9, the array substrate made by the method of an embodiment of the present invention comprises: the substrate 90, the common electrodes 40 on the substrate 90, the common electrode signal lines 51 on the common electrodes 40, the gate insulation layer 91 on the common electrode signal lines 51, a semiconductor active layer 92 on the gate insulation layer 91, the data signal lines 61 on the semiconductor active layer 92, the insulation layer 93 on the data signal lines 61, and the pixel electrodes 80 on the insulation layer 93.

In the method of manufacturing the array substrate according to the above embodiments of the present invention, the gate signal lines and the common electrode signal line units are formed on the substrate, and each of the common electrode signal line units corresponding to each of the common electrodes comprises the first common electrode signal line perpendicular to the gate signal line and the second common electrode signal line parallel to the gate signal line, the first common electrode signal line and the second common electrode signal line both are made of metal, the first common electrode signal line and the second common electrode signal line of each of the common electrode signal line units cross with each other and are electrically connected to each other, and two adjacent common electrode signal line units are electrically connected by the bridge line. Thereby, it can reduce the resistance of the common electrode in the direction perpendicular to the gate signal line, and in turn decrease voltage distribution gradient in the direction perpendicular to the gate signal line, increasing the resistance uniformity of the array substrate, and improving image display quality of a display apparatus comprising the array substrate.

According to another exemplary embodiment of the present invention, there is also provided a display apparatus comprising the array substrate according to any one of the above embodiments. In an exemplary embodiment, the display apparatus may be a FFS mode of liquid crystal display panel. In this way, as described above, the image display quality of the display apparatus can be greatly improved in the embodiments of the present invention.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An array substrate, comprising:
   a substrate;
   a plurality of common electrodes formed on the substrate;
   a plurality of gate signal lines formed above the common electrodes; and
   a plurality of common electrode signal line units corresponding to the plurality of common electrodes, respectively, and formed on the corresponding common electrodes, respectively,
   wherein each of the common electrode signal line units comprises a first common electrode signal line perpendicular to the gate signal line and a second common electrode signal line parallel to the gate signal line;
   wherein the first common electrode signal line and the second common electrode signal line both are made of metal;
   wherein the first common electrode signal line and the second common electrode signal line of each of the common electrode signal line units cross with each other and are electrically connected to each other; and
   wherein two adjacent common electrode signal line units are electrically connected by a bridge line.

2. The array substrate according to claim 1, further comprising:
   a thin film transistor composed of a gate electrode, a gate insulation layer, a semiconductor active layer, a source electrode and a drain electrode.

3. The array substrate according to claim 2, further comprising:
   data signal lines formed above the gate signal lines and the common electrode signal lines;
   an insulation layer formed above the data signal lines; and
   pixel electrodes formed above the insulation layer.

4. The array substrate according to claim 3, wherein the bridge line is made of metal, and formed in the same layer as the data signal line, the source electrode and the drain electrode.

5. The array substrate according to claim 3, wherein two adjacent first common electrode signal lines are electrically connected by the bridge line through a first via, a second via, a third via and a fourth via.

6. The array substrate according to claim 5,
wherein the first via is located above the first common electrode signal line, and passes through the insulation layer and the data signal line;
wherein the second via is located above the second common electrode signal line, and passes through the insulation layer and the data signal line; and
wherein the third via and the fourth via are located above the bridge line, and pass through the insulation layer.

7. The array substrate according to claim 6,
wherein one of the pixel electrodes is formed between the first and third vias and inside the first and third vias to electrically connect the first common electrode signal line of one of the common electrodes in one column to the bridge line; and
wherein another of the pixel electrodes is formed between the second and fourth vias and inside the second and fourth vias to electrically connect the first common electrode signal line of another of the common electrodes in said one column, adjacent to said one of the common electrodes in said one column, to the bridge line.

8. The array substrate according to claim 3, wherein the common electrode is made of indium tin oxide.

9. The array substrate according to claim 3, wherein the first common electrode signal line and the second common electrode signal line are formed in the same layer as the gate electrode and the gate signal line.

10. The array substrate according to claim 3, wherein the pixel electrode is made of indium tin oxide.

11. A display apparatus, comprising the array substrate according to claim 1.

12. The display apparatus according to claim 11,
wherein the array substrate further comprises a thin film transistor composed of a gate electrode, a gate insulation layer, a semiconductor active layer, a source electrode and a drain electrode.

13. The display apparatus according to claim 12, wherein the array substrate further comprising:
data signal lines formed above the gate signal lines and the common electrode signal lines;
an insulation layer formed above the data signal lines; and
pixel electrodes formed above the insulation layer.

14. The display apparatus according to claim 13, wherein the bridge line is made of metal, and formed in the same layer as the data signal line, the source electrode and the drain electrode.

15. The display apparatus according to claim 13, wherein two adjacent first common electrode signal lines are electrically connected by the bridge line through a first via, a second via, a third via and a fourth via.

16. The display apparatus according to claim 15,
wherein the first via is located above the first common electrode signal line, and passes through the insulation layer and the data signal line;
wherein the second via is located above the second common electrode signal line, and passes through the insulation layer and the data signal line; and
wherein the third via and the fourth via are located above the bridge line, and pass through the insulation layer.

17. The display apparatus according to claim 16,
wherein one of the pixel electrodes is formed between the first and third vias and inside the first and third vias to electrically connect the first common electrode signal line of one of the common electrodes in one column to the bridge line; and
wherein another of the pixel electrodes is formed between the second and fourth vias and inside the second and fourth vias to electrically connect the first common electrode signal line of another of the common electrodes in said one column, adjacent to said one of the common electrodes in said one column.

18. The display apparatus according to claim 13,
wherein the first common electrode signal line and the second common electrode signal line are formed in the same layer as the gate electrode and the gate signal line.

19. A method for manufacturing an array substrate, comprising steps of:
forming a plurality of common electrodes on a substrate;
forming a plurality of gate signal lines and a plurality of common electrode signal line units corresponding to the plurality of common electrodes, respectively, on the substrate;
forming a plurality of data signal lines and a plurality of bridge lines on the substrate; and
sequentially forming an insulation layer and a plurality of pixel electrodes on the substrate,
wherein each of the common electrode signal line units comprises a first common electrode signal line perpendicular to the gate signal line and a second common electrode signal line parallel to the gate signal line;
wherein the first common electrode signal line and the second common electrode signal line both are made of metal;
wherein the first common electrode signal line and the second common electrode signal line of each of the common electrode signal line units cross with each other and are electrically connected to each other; and
wherein two adjacent common electrode signal line units are electrically connected by the bridge line.

20. The method according to claim 19,
wherein the data signal line and the bridge line are formed in the same layer, and
wherein the bridge line is made of metal.

* * * * *